(12) United States Patent
Tsubota et al.

(10) Patent No.: US 12,040,161 B2
(45) Date of Patent: Jul. 16, 2024

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Yasutoshi Tsubota, Toyama (JP); Masanori Nakayama, Toyama (JP); Katsunori Funaki, Toyama (JP); Tatsushi Ueda, Toyama (JP); Eiko Takami, Toyama (JP); Yuichiro Takeshima, Toyama (JP); Hiroto Igawa, Toyama (JP); Yuki Yamakado, Toyama (JP); Keita Ichimura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 384 days.

(21) Appl. No.: 17/477,296

(22) Filed: Sep. 16, 2021

(65) Prior Publication Data

US 2022/0005673 A1 Jan. 6, 2022

Related U.S. Application Data

(63) Continuation of application No. PCT/JP2019/011461, filed on Mar. 19, 2019.

(51) Int. Cl.
*H05H 1/24* (2006.01)
*H01J 37/32* (2006.01)
(Continued)

(52) U.S. Cl.
CPC .... *H01J 37/3244* (2013.01); *H01L 21/02252* (2013.01); *H01L 21/02323* (2013.01); *H01L 21/3003* (2013.01)

(58) Field of Classification Search
CPC .. H05H 1/24; H01L 21/02252; H01L 21/3003
See application file for complete search history.

(56) References Cited

U.S. PATENT DOCUMENTS

2008/0110569 A1 5/2008 Miya et al.
2010/0034349 A1* 2/2010 Kraus ................ G03F 7/70925
378/41
(Continued)

FOREIGN PATENT DOCUMENTS

CN 105374704 A 3/2016
CN 109075071 A 12/2018
(Continued)

OTHER PUBLICATIONS

Konno, Junya, et al., "Excitation Kinetics of Oxygen O(1D) State in Low-Pressure Oxygen Plasma and the Effect of Electron Energy Distribution Function". Journal of Advanced Oxidation Technologies. 2017; 20170002, pp. 1-13.*
(Continued)

*Primary Examiner* — Bret P Chen
(74) *Attorney, Agent, or Firm* — Volpe Koenig

(57) ABSTRACT

A method of manufacturing a semiconductor device includes accommodating a substrate in a process chamber; supplying a first gas containing oxygen into the process chamber; generating plasma in the process chamber by exciting the first gas; supplying a second gas containing hydrogen into the process chamber and adjusting a hydrogen concentration distribution in the process chamber according to a density distribution of the plasma in the process chamber; and processing the substrate with oxidizing species generated by the plasma.

13 Claims, 9 Drawing Sheets

(51) Int. Cl.
    *H01L 21/02*   (2006.01)
    *H01L 21/30*   (2006.01)

(56) References Cited

U.S. PATENT DOCUMENTS

| | | | |
|---|---|---|---|
| 2010/0307685 A1* | 12/2010 | Ota | C23C 16/511 |
| | | | 156/345.33 |
| 2014/0106573 A1 | 4/2014 | Terasaki et al. | |
| 2015/0099058 A1* | 4/2015 | Takizawa | C23C 16/4554 |
| | | | 427/8 |
| 2016/0056021 A1 | 2/2016 | Tsujimoto et al. | |
| 2016/0056035 A1 | 2/2016 | Toyoda et al. | |
| 2019/0032217 A1* | 1/2019 | Yoshino | H01J 37/32568 |

FOREIGN PATENT DOCUMENTS

| | | |
|---|---|---|
| JP | 2008-141147 A | 6/2008 |
| JP | 2014-075579 A | 4/2014 |
| JP | 2014-225505 A | 12/2014 |
| JP | 2016-046415 A | 4/2016 |
| WO | 2017/183401 A1 | 10/2017 |

OTHER PUBLICATIONS

Glatz, Bernhard Alexander, et al., "The influence of plasma treatment on the elasticity of the in situ oxidized gradient layer in PDMS: towards crack-free wrinkling". Soft Matter, 2019, 15, 65-72.*

Kawasaki, Toshiyuki, et al., "Visualization of the Distribution of Oxidizing Substances in an Atmospheric Pressure Plasma Jet". IEEE Transactions on Plasma Science, vol. 42, No. 10, Oct. 2014, pp. 2482-2483.*

Korean Office Action issued on Sep. 15, 2023 for Korean Patent Application No. 10-2021-7029378.

Chinese Office Action issued on Jul. 27, 2023 for Chinese Patent Application No. 201980093646.X.

International Search Report with English Translation, PCT/JP2019/011461, May 21, 2019 (5 pgs).

Japanese Office Action issued on Jun. 21, 2022 for Japanese Patent Application No. 2021-506889.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT International Application No. PCT/JP2019/011461, filed on Mar. 19, 2019, the entire content of which is incorporated herein by reference.

TECHNICAL FIELD

The present disclosure relates to a method of manufacturing a semiconductor device, a substrate processing apparatus, and a recording medium.

BACKGROUND

When forming a pattern of a semiconductor device such as a flash memory, as a manufacturing process, a process of performing a predetermined process such as an oxidizing process or a nitriding process on a substrate may be often performed.

For example, in the related art, it is known that a pattern surface formed on a substrate is modified by using a plasma-excited process gas.

SUMMARY

Some embodiments of the present disclosure provide a technique capable of controlling the in-plane distribution of oxidizing species supplied on a substrate.

According to one or more embodiments of the present disclosure, there is provided a technique that includes accommodating a substrate in a process chamber; supplying a first gas containing oxygen into the process chamber; generating plasma in the process chamber by exciting the first gas; supplying a second gas containing hydrogen into the process chamber and adjusting a hydrogen concentration distribution in the process chamber according to a density distribution of the plasma in the process chamber; and processing the substrate with oxidizing species generated by the plasma.

DETAILED DESCRIPTION

Figure 1:
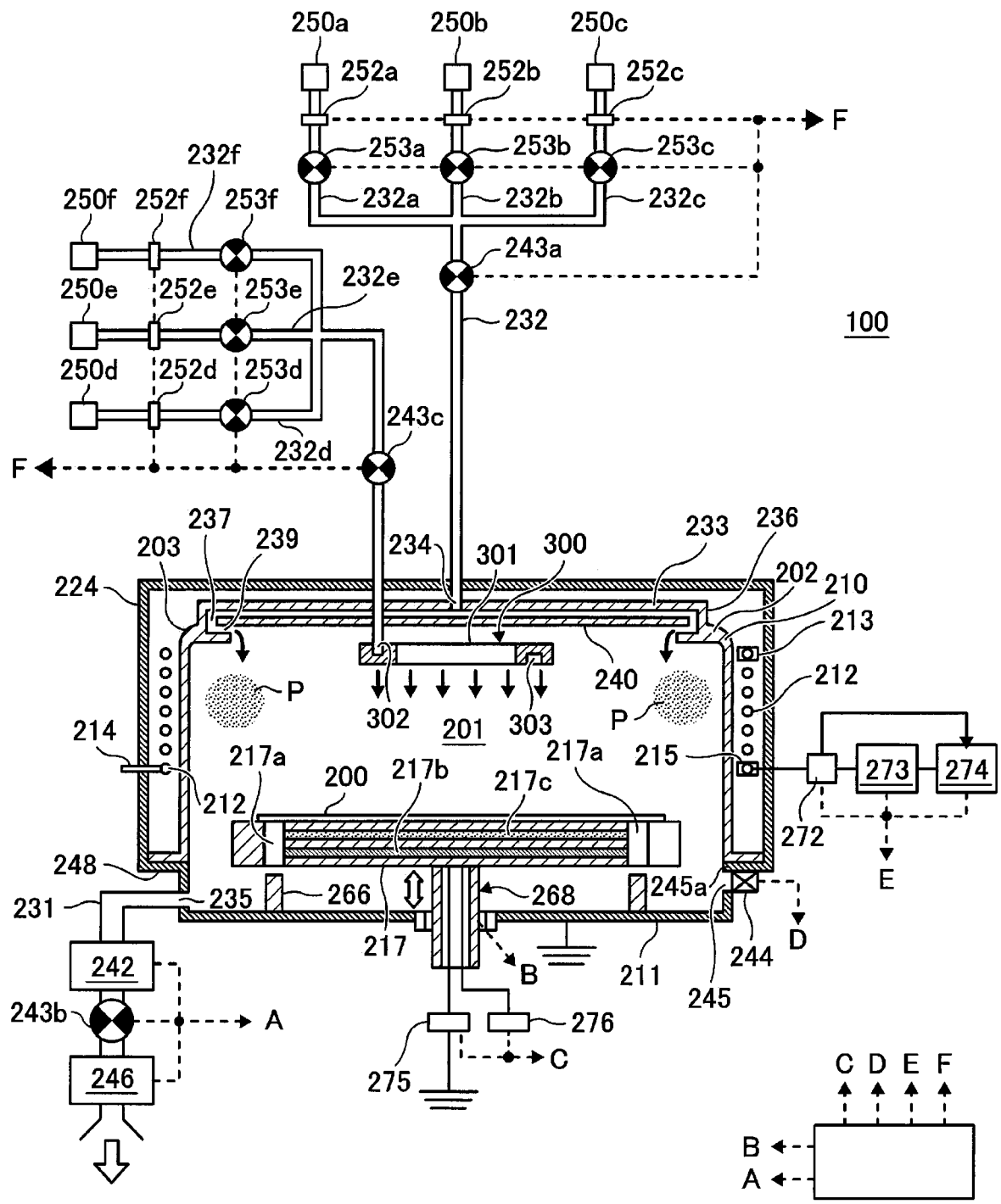
FIG. 1 is a schematic cross-sectional view of a substrate processing apparatus according to one or more embodiments of the present disclosure.

First Embodiments of the Present Disclosure (1) Configuration of Substrate Processing Apparatus A substrate processing apparatus according to first embodiments of the present disclosure will be now described with reference to FIGS. 1 and 2. The substrate processing apparatus according to the present embodiments is configured to mainly perform an oxidizing process on a film formed on a substrate surface.

(Process Chamber)

The substrate processing apparatus 100 includes a process furnace 202 that processes a wafer 200 by using plasma. A process container 203 that constitutes a process chamber 201 is installed in the process furnace 202. The process container 203 includes a dome-shaped upper container 210, which is a first container, and a bowl-shaped lower container 211, which is a second container. The process chamber 201 is formed by covering the upper container 210 on the lower container 211. The upper container 210 is made of, for example, a non-metallic material such as aluminum oxide ($Al_2O_3$) or quartz ($SiO_2$), and the lower container 211 is made of, for example, aluminum (Al).

A gate valve 244 is installed on a lower sidewall of the lower container 211. When the gate valve 244 is opened, the wafer 200 is loaded/unloaded in/out of the process chamber 201 via the loading/unloading port 245 by using a transfer mechanism (not shown). The gate valve 244 is configured to be a gate valve that maintains airtightness in the process chamber 201 when the gate valve 244 is closed.

The process chamber 201 has a plasma-generating space 201a installed with a coil 212 around it, and a substrate-processing space 201b that communicates with the plasma-generating space 201a and processes the wafer 200. The plasma-generating space 201a is a space in which plasma is generated, and refers to a space above the lower end of the coil 212 and below the upper end of the coil 212 in the process chamber. On the other hand, the substrate-processing space 201b is a space in which a substrate is processed by using plasma, and refers to a space below the lower end of the coil 212. In the present embodiments, the diameters of the plasma-generating space 201a and the substrate-processing space 201b in the horizontal direction are substantially the same.

(Susceptor)

A susceptor 217 constituting a substrate-mounting part (substrate-mounting table) on which the wafer 200 is mounted is disposed at the center of the bottom side of the process chamber 201. The susceptor 217 is made of, for example, a non-metallic material such as aluminum nitride (AlN), ceramics, or quartz.

A heater 217b as a heating mechanism is integrally buried inside the susceptor 217. The heater 217b is configured to be able to heat the surface of the wafer 200 from, for example, about 25 degrees C. to about 750 degrees C. when electric power is supplied.

The susceptor 217 is electrically insulated from the lower container 211. An impedance adjustment electrode 217c is installed inside the susceptor 217 and is grounded via an impedance variable mechanism 275 as an impedance adjustment part. The impedance variable mechanism 275 includes a coil and a variable capacitor and is configured so as to change the impedance by controlling the inductance and resistance of the coil and the capacitance of the variable capacitor. As a result, the potential (bias voltage) of the wafer 200 can be controlled via the impedance adjustment electrode 217c and the susceptor 217. In the present embodiments, it is possible to arbitrarily select whether or not to perform the bias voltage control by using the impedance adjustment electrode 217c.

The susceptor 217 is installed with a susceptor-elevating mechanism 268 including a drive mechanism for raising and lowering the susceptor. Further, the susceptor 217 is installed with through-holes 217a, and wafer push-up pins 266 are installed on the bottom surface of the lower container 211. The through-holes 217a and the wafer push-up pins 266 are installed at least three positions facing each other. When the susceptor 217 is lowered by the susceptor-elevating mechanism 268, the wafer push-up pins 266 penetrate through the through-holes 217a.

A substrate-mounting part according to the present embodiments mainly includes the susceptor 217, the heater 217b, and the electrode 217c.

(First Gas Supply Part)

A gas supply head 236 is installed above the process chamber 201, that is, in the upper portion of the upper container 210. The gas supply head 236 includes a cap-shaped lid 233, a gas introduction port 234, a buffer chamber 237, an opening 238, a shielding plate 240, and a gas ejection port 239, and is configured to be able to supply a reaction gas into the process chamber 201. The buffer chamber 237 has a function as a dispersion space for dispersing the reaction gas introduced from the gas introduction port 234. The gas ejection port 239 is configured as a slit-shaped opening installed along the inner circumference of the process chamber 201, so that the reaction gas can be uniformly supplied toward the vicinity of the inner peripheral wall of the process chamber 201 in the circumferential direction of the process chamber 201.

The downstream end of an oxygen-containing gas supply pipe 232a for supplying an oxygen ($O_2$) gas as an oxygen-containing gas, the downstream end of a hydrogen-containing gas supply pipe 232b for supplying a hydrogen ($H_2$) gas as a hydrogen-containing gas, and an inert gas supply pipe 232c for supplying a nitrogen ($N_2$) gas as an inert gas are connected to the gas introduction port 234 so that they merge with one another. The oxygen-containing gas supply pipe 232a is installed with an $O_2$ gas supply source 250a, a mass flow controller (MFC) 252a as a flow control device, and a valve 253a as an opening/closing valve. The hydrogen-containing gas supply pipe 232b is installed with a $H_2$ gas supply source 250b, a MFC 252b, and a valve 253b. The inert gas supply pipe 232c is installed with a $N_2$ gas supply source 250c, a MFC 252c, and a valve 253c. A valve 243a is installed on the downstream side where the oxygen-containing gas supply pipe 232a, the hydrogen-containing gas supply pipe 232b, and the inert gas supply pipe 232c merge with one another and is connected to the upstream end of the gas introduction port 234. The valves 253a, 253b, 253c, and 243a are opened/closed to allow process gases such as the oxygen-containing gas, the hydrogen gas-containing gas, and the inert gas to be supplied into the process chamber 201 via the oxygen-containing gas supply pipe 232a, the hydrogen-containing gas supply pipe 232b, and the inert gas supply pipe 232c while adjusting the flow rate of the gases by the MFCs 252a, 252b, and 252c, respectively.

A first gas supply part (first gas supply system) according to the present embodiments mainly includes the gas supply head 236 (the lid 233, the gas introduction port 234, the buffer chamber 237, the opening 238, the shielding plate 240, and the gas ejection port 239), the oxygen-containing gas supply pipe 232a, the hydrogen-containing gas supply pipe 232b, the inert gas supply pipe 232c, the MFCs 252a, 252b, and 252c, and the valves 253a, 253b, 253c, and 243a. The first gas supply part is configured to supply a gas as an oxygen-containing oxidizing species source into the process chamber 201. Hereinafter, a gas supplied from the first gas supply part is referred to as a first gas.

(Second Gas Supply Part)

A gas supply ring 300 is installed above the center of the process chamber 201. The gas supply ring 300 includes a gas supply pipe 301, which is a ring-shaped nozzle, a gas introduction port 302, and a plurality of gas ejection holes 303, and is configured to supply the reaction gas into the process chamber 201. The plurality of gas ejection holes 303 are arranged to form a uniform spacing along the ring-shaped circumferential direction on, for example, the lower surface of the gas supply pipe 301, so that they can supply the reaction gas uniformly in the circumferential direction of the process chamber 201.

The downstream end of an oxygen-containing gas supply pipe 232d for supplying an $O_2$ gas as an oxygen-containing gas, the downstream end of a hydrogen-containing gas supply pipe 232e for supplying a $H_2$ gas as a hydrogen-containing gas, and an inert gas supply pipe 232f for supplying a $N_2$ gas as an inert gas are connected to the gas introduction port 302 so that they merge with one another. The oxygen-containing gas supply pipe 232d is installed with an $O_2$ gas supply source 250d, a MFC 252d, and a valve 253d. The hydrogen-containing gas supply pipe 232e is installed with a $H_2$ gas supply source 250e, a MFC 252e, and a valve 253e. The inert gas supply pipe 232f is installed with a $N_2$ gas supply source 250f, a MFC 252f, and a valve 253f. A valve 243c is installed on the downstream side where the oxygen-containing gas supply pipe 232d, the hydrogen-containing gas supply pipe 232e, and the inert gas supply pipe 232f merge with one another and is connected to the upstream end of the gas introduction port 302. The valves 253d, 253e, 253f, and 243c are opened/closed to allow process gases such as the oxygen-containing gas, the hydrogen gas-containing gas, and the inert gas to be supplied into the process chamber 201 via the oxygen-containing gas supply pipe 232d, the hydrogen-containing gas supply pipe 232e, and the inert gas supply pipe 232f while adjusting the flow rate of the gases by the MFCs 252d, 252e, and 252f, respectively.

A second gas supply part (second gas supply system) according to the present embodiments mainly includes the gas supply ring 300, the oxygen-containing gas supply pipe 232d, the hydrogen-containing gas supply pipe 232e, the inert gas supply pipe 232f, the MFCs 252d, 252e, and 252f, and the valves 253d, 253e, 253f, and 243c. The second gas supply part is configured to supply a hydrogen concentration adjustment gas for adjusting the hydrogen concentration, which contains hydrogen, into the process chamber 201. Hereinafter, a gas supplied from the second gas supply part is referred to as a second gas.

The first gas supply part is configured to supply the first gas to an outer peripheral region, which is a first region in the plasma-generating space 201a (which will be described later) along the inner wall of the process chamber 201. Further, the second gas supply part is configured to supply the second gas to a central region, which is a region surrounded by the outer peripheral region and is a second region in the plasma-generating space 201a. That is, the first gas is supplied to the outer peripheral region in the process chamber 201, and the second gas is supplied to the central region which includes a region above the processing surface of the wafer 200 and is a region different from the outer peripheral region in the surface direction of the wafer 200. The inner space of the process chamber 201 includes the outer peripheral region along the inner wall of the process chamber 201 and the central region surrounded by the outer peripheral region.

With the first gas supply part and the second gas supply part, it is possible to adjust the mixture ratio (flow rate ratio) of $O_2$ gas and $H_2$ gas and the total flow rate thereof for each of the first gas and the second gas. Therefore, it is possible to adjust the mixture ratio of $O_2$ gas and $H_2$ gas supplied respectively to the outer peripheral region and the central region in the process chamber 201 and the total flow rate thereof.

(Exhaust Part)

A gas exhaust port 235 for exhausting a reaction gas or the like from the interior of the process chamber 201 is installed on the side wall of the lower container 211. The upstream end of a gas exhaust pipe 231 is connected to the gas exhaust port 235. The gas exhaust pipe 231 is installed with an auto pressure controller (APC) valve 242 as a pressure regulator, a valve 243b as an opening/closing valve, and a vacuum pump 246 as a vacuum exhaust device. An exhaust port according to the present embodiments mainly includes the gas exhaust port 235, the gas exhaust pipe 231, the APC valve 242, and the valve 243b. The vacuum pump 246 may be included in the exhaust part.

(Plasma Generation Part)

The spiral resonance coil 212 as a high frequency electrode is installed on the outer periphery of the process chamber 201, that is, on the outside of the side wall of the upper container 210 so as to surround the process chamber 201. A matching device 274 that matches the impedance and output frequency of a RF sensor 272, a high frequency power supply 273, and a high frequency power supply 273 is connected to the resonance coil 212.

The high frequency power supply 273 supplies high frequency power (RF power) to the resonance coil 212. The RF sensor 272 is installed on the output side of the high frequency power supply 273 and monitors information of a traveling wave and a reflected wave of the supplied high frequency. The reflected wave power monitored by the RF sensor 272 is input to the matching device 274, and the matching device 274 controls the impedance of the high frequency power supply 273 and the frequency of the output high frequency power so as to minimize the reflected wave, based on the information of the reflected wave input from the RF sensor 272.

The resonance coil 212 sets the winding diameter, winding pitch, and number of turns so as to be resonated at a constant wavelength in order to form a standing wave having a predetermined wavelength. That is, the electrical length of the resonance coil 212 is set to a length corresponding to an integral multiple of one wavelength at a predetermined frequency of the high frequency power supplied from the high frequency power supply 273.

Specifically, in consideration of applied power, a generated magnetic field strength, the outer shape of an applied device, and the like, the resonance coil 212 has the effective sectional area of 50 to 300 $mm^2$ and the coil diameter of 200 to 500 mm so as to generate a magnetic field of about 0.01 to 10 Gauss with high frequency power of, for example, 800 kHz to 50 MHz and 0.1 to 5 KW, and is wound about 2 to 60 times on the outer peripheral side of the plasma-generating space 201a. The notation of a numerical range such as "800 kHz to 50 MHz" in the present disclosure means that the lower limit value and the upper limit value are included in the range. For example, "800 kHz to 50 MHz" means "800 kHz or more and 50 MHz or less." The same applies to other numerical ranges.

In the present embodiments, the frequency of high frequency power is set to 27.12 MHz, and the electrical length of the resonance coil 212 is set to the length of one wavelength (about 11 meters). The winding pitch of the resonance coil 212 is set at equal intervals of, for example, 24.5 mm. Further, the winding diameter of the resonance coil 212 is set to be larger than the diameter of the wafer 200. In the present embodiments, the diameter of the wafer 200 is set to 300 mm, and the winding diameter of the resonance coil 212 is set to be 500 mm, which is larger than the diameter of the wafer 200.

Both ends of the resonance coil 212 are electrically grounded, and at least one selected from the group of which is grounded via a movable tap 213 to fine-tune the electrical length of the resonance coil 212 at the time of initial installation of the device or at the time of changing a process condition. Reference numeral 214 in FIG. 1 denotes the fixed ground of the other end. The position of the movable tap 213 is adjusted so as to substantially equal the resonance characteristic of the resonance coil 212 to that of the high frequency power supply 273. Further, a power-feeding part is configured by a movable tap 215 between the grounded both ends of the resonance coil 212 in order to fine-tune the impedance of the resonance coil 212 at the time of initial installation of the device or at the time of changing the process condition.

A shielding plate 224 is installed to shield an electric field outside the resonance coil 212.

A plasma generator according to the present embodiments mainly includes the resonance coil 212, the RF sensor 272, and the matching device 274. The high frequency power supply 273 may be included as the plasma generation part.

Here, the plasma generation principle and the properties of the generated plasma of the apparatus according to the present embodiments will be described with reference to FIG. 2. The plasma generator in the present embodiments is configured to generate plasma by an ICP (Inductively Coupled Plasma) method as follows. A plasma generation circuit composed of the resonance coil 212 is configured as an RLC parallel resonance circuit. In the above plasma generation circuit, when plasma is generated, the actual resonance frequency fluctuates slightly depending on a fluctuation in a capacitive coupling between a voltage part of the resonance coil 212 and the plasma, a fluctuation in an inductive coupling between the plasma-generating space 201a and the plasma, and an excitation state of the plasma, and the like.

Therefore, in order to compensate a deviation of resonance in the resonance coil 212 on the power supply side when the plasma is generated, the present embodiments provide a function of detecting, by the RF sensor 272, the reflected wave power from the resonance coil 212 when the plasma is generated, and correcting, by the matching device 274, the output of the high frequency power supply 273 based on the reflected wave power that has been detected.

Specifically, the matching device 274 increases or decreases the impedance or output frequency of the high frequency power supply 273 so as to minimize the reflected wave power based on the reflected wave power from the resonance coil 212 when the plasma detected by the RF sensor 272 is generated.

Figure 2:
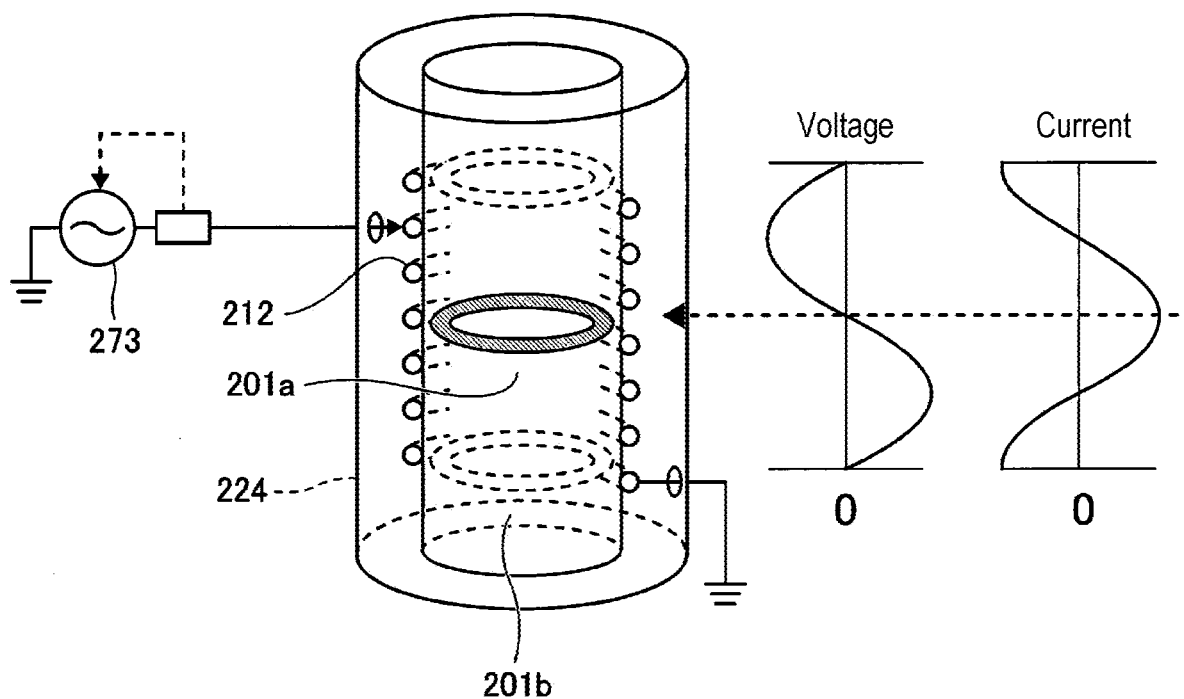
FIG. 2 is an explanatory view for explaining the plasma generation principle of the substrate processing apparatus according to the embodiments of the present disclosure.

As shown in FIG. 2, since the resonance coil 212 in the present embodiments is supplied with high frequency power at the actual resonance frequency of the resonance coil including plasma (or is supplied with the high frequency power so as to match with the actual impedance of the resonance coil including plasma), a standing wave is formed in which a phase voltage and an anti-phase voltage are always cancelled out. When the electrical length of the resonance coil 212 is equal to the wavelength of the high frequency power, the highest phase current is generated at the electrical midpoint (node of zero voltage) of the coil. Therefore, in the vicinity of the electrical midpoint, since there is almost no capacitive coupling with the process chamber wall or the susceptor 217, ring-shaped inductive plasma having an extremely low electrical potential is formed.

With this configuration, since the resonance coil 212 is installed so as to be wound around the outer periphery of the process chamber 201, when the high frequency power is supplied to the resonance coil 212, ring-shaped plasma is generated in a region which is in the vicinity of the resonance coil 212 and along the inner periphery of the process chamber 201. That is, this ring-shaped plasma is generated in the outer peripheral region in the process chamber 201. In particular, in the present embodiments, this ring-shaped plasma is generated at a height at which the electrical midpoint of the resonance coil 212 is located, that is, at an intermediate height position between the upper end and the lower end of the resonance coil 212.

(Control Part)

A controller 221 as a control part is configured to control the APC valve 242, the valve 243b, and the vacuum pump 246 through a signal line A, the susceptor-elevating mechanism 268 through a signal line B, a heater-power-adjusting mechanism 276 and the impedance variable mechanism 275 through a signal line C, the gate valve 244 through a signal line D, the RF sensor 272, the high frequency power supply 273, and the matching device 274 through a signal line E, and the MFCs 252a to 252f and the valves 253a to 253f, 243a, and 243c through a signal line F.

Figure 3:
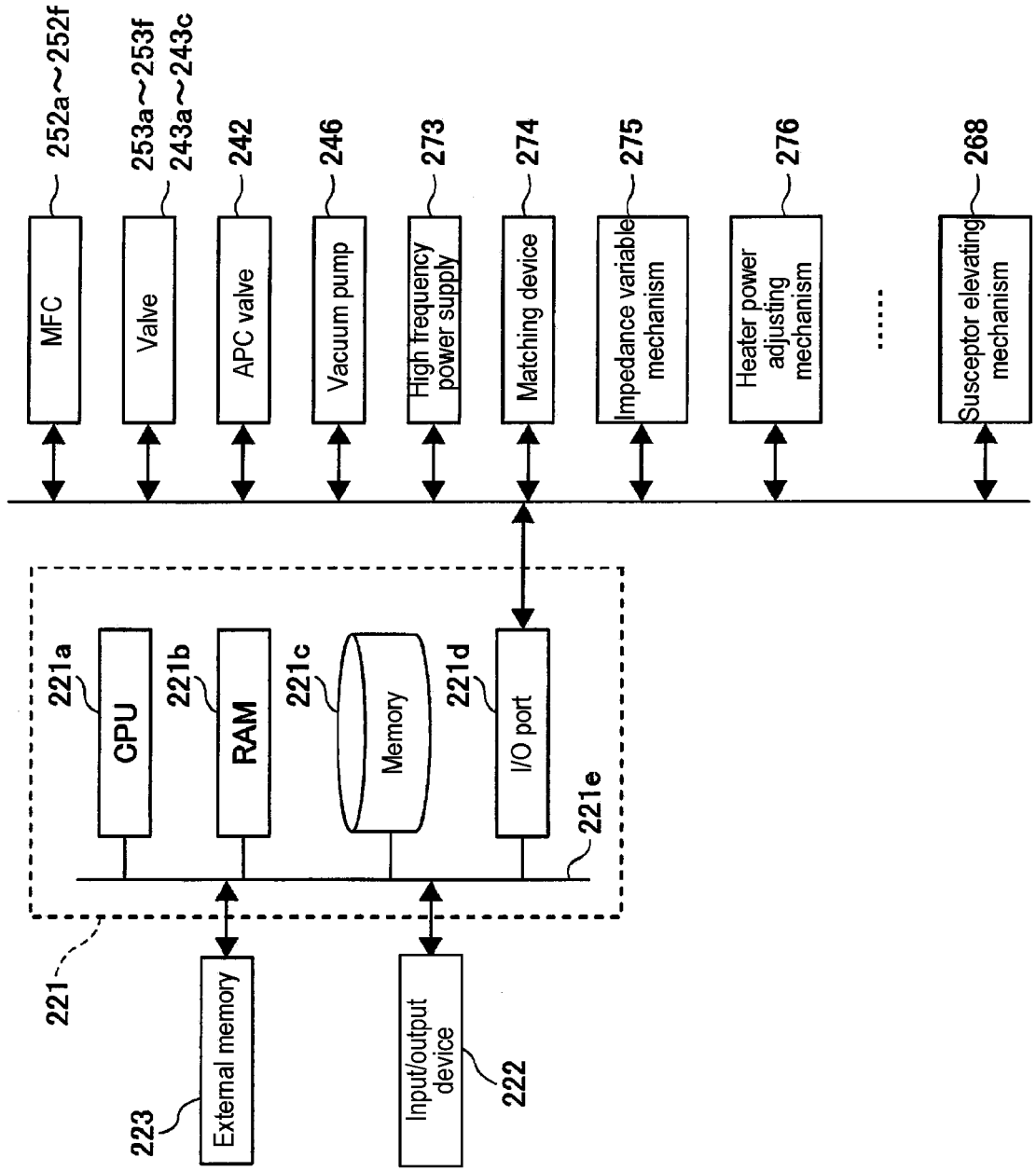
FIG. 3 is a diagram showing the configuration of a control part (control unit or control means) of the substrate processing apparatus according to the embodiments of the present disclosure.

As shown in FIG. 3, the controller 221, which is the control part (control unit or control means), is configured as a computer including a CPU (Central Processing Unit) 221a, a RAM (Random Access Memory) 221b, a memory 221c, and an I/O port 221d. The RAM 221b, the memory 221c, and the I/O port 221d are configured to be capable of exchanging data with the CPU 221a via an internal bus 221e. An input/output device 222 configured as, for example, a touch panel or a display is connected to the controller 221.

The memory 221c is configured by, for example, a flash memory, a hard disk drive (HDD), or the like. A control program for controlling operations of a substrate processing apparatus and a process recipe, in which sequences and conditions of substrate processing, which will be described later, are written, are readably stored in the memory 221c. The process recipe functions as a program for causing the controller 221 to execute each sequence in a substrate-processing process, which will be described later, to obtain a predetermined result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 221b is configured as a memory area (work area) in which a program or data read by the CPU 221a is temporarily stored.

The I/O port 221d is connected to the MFCs 252a to 252f, the valves 253a to 253f, 243a, 243b, and 243c, the gate valve 244, the APC valve 242, the vacuum pump 246, the RF sensor 272, the high frequency power supply 273, the matching device 274, the susceptor-elevating mechanism 268, the impedance variable mechanism 275, the heater-power-adjusting mechanism 276, and the like.

The CPU 221a is configured to read and execute the control program from the memory 221c. The CPU 221a is also configured to read the process recipe from the memory 221c according to an input of an operation command from the input/output device 222. Then, the CPU 221a is configured to control the operation of adjusting the opening degree of the APC valve 242, the opening/closing operation of the valve 243b, the actuating and stopping of the vacuum pump 246 through the I/O port 221d and the signal line A, the elevating operation of the susceptor-elevating mechanism 268 through the signal line B, the operation of adjusting the amount of power supplied to the heater 217b by the heater-power-adjusting mechanism 276 and the operation of adjusting the impedance by the impedance variable mechanism 275 through the signal line C, the opening/closing operation of the gate valve 244 through the signal line D, the operations of the RF sensor 272, the matching device 274 and the high frequency power supply 273 through the signal line E, the operation of adjusting flow rates of various kinds of gases by the MFCs 252a to 252f and the opening/closing operation of the valves 253a to 253f, 243a, and 243c through the signal line F, and the like, according to contents of the read process recipe.

The controller 221 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 223. The memory 221c and the external memory 223 are configured as a non-transitory computer-readable recording medium. Hereinafter, the memory 221c and the external memory 223 may be generally and simply referred to as a "recording medium." When the term "recording medium" is used herein, it may indicate a case of including the memory 221c only, a case of including the external memory 223 only, or a case of including both the memory 221c and the external memory 223. The program may be provided to the computer by using a communication means or communication unit such as the Internet or a dedicated line, instead of using the external memory 223.

(2) Substrate-Processing Process

Figure 4:
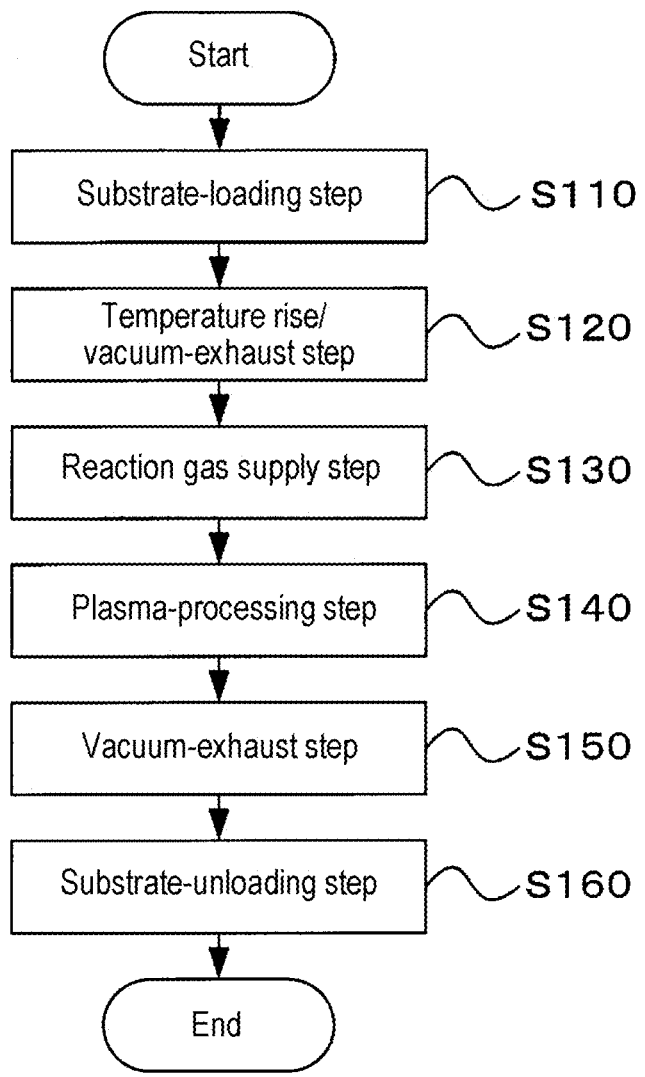
FIG. 4 is a flow chart showing a substrate-processing process according to the embodiments of the present disclosure.

Next, a substrate-processing process according to the present embodiments will be described mainly with reference to FIG. 4. FIG. 4 is a flow chart showing a substrate-processing process according to the present embodiments. The substrate-processing process according to the present embodiments is a process of manufacturing a semiconductor device such as a flash memory by using the above-described substrate processing apparatus 100. An example of a method of forming a silicon oxide (SiO) film by oxidizing the surface of a wafer 200 on which a silicon (Si)-containing film is formed will be described. In the following description, the operations of various parts constituting the substrate processing apparatus 100 are controlled by the controller 221.

(Substrate-Loading Step S110)

First, the wafer 200 is loaded and accommodated into the process chamber 201. Specifically, the susceptor-elevating mechanism 268 lowers the susceptor 217 to a transfer position of the wafer 200. As a result, the wafer push-up pins 266 protrude from the through-holes 217a by a predetermined height from the surface of the susceptor 217.

Subsequently, the gate valve 244 is opened, and the wafer 200 is loaded into the process chamber 201 from a vacuum transfer chamber adjacent to the process chamber 201 by using a wafer transfer mechanism (not shown). The loaded wafer 200 is supported in a horizontal posture on the wafer push-up pins 266. After the wafer 200 is loaded into the process chamber 201, the gate valve 244 is closed to seal the interior of the process chamber 201. Then, the susceptor-elevating mechanism 268 raises the susceptor 217 so that the wafer 200 is supported on the upper surface of the susceptor 217.

(Temperature Rise/Vacuum-Exhaust Step S120)

Subsequently, the temperature of the wafer 200 loaded into the process chamber 201 is raised. The heater 217b is preheated, and by holding the wafer 200 on the susceptor 217 in which the heater 217b is embedded, the wafer 200 is heated to a predetermined value in the range of, for example, 150 to 750 degrees C. Here, the wafer 200 is heated so as to have a temperature of 600 degrees C. Further, while the temperature of the wafer 200 is raised, the interior of the process chamber 201 is vacuum-exhausted by the vacuum pump 246 via the gas exhaust pipe 231 to set the internal pressure of the process chamber 201 to a predetermined value. The vacuum pump 246 keeps operated at least until a substrate-unloading step S160 to be described later is completed.

(Reaction Gas Supply Step S130)

Next, the supply of a mixture of $O_2$ gas and $H_2$ gas as the first gas, which is an oxygen-containing oxidizing species source gas, from the first gas supply part to the outer peripheral region of the process chamber 201 is started. Specifically, the valve 253a and the valve 253b are opened, and the supply of the first gas into the process chamber 201 via the gas ejection port 239 is started while its flow rate is controlled by the MFC 252a and the MFC 252b.

By controlling the flow rate with the MFC 252a and the MFC 252b, at least one selected from the group of the total flow rate of the first gas and the composition of the first gas (particularly, the hydrogen content or content rate) is adjusted. In the present embodiments, it is possible to easily adjust the composition of the first gas by changing the mixture ratio (flow rate ratio) of the $H_2$ gas and the $O_2$ gas.

At this time, the total flow rate of the first gas is set to, for example, 1,000 to 5,000 sccm, and the flow rate of the $O_2$ gas in the first gas is set to a predetermined value within the range of, for example, 20 to 2,000 sccm, specifically 20 to 1,000 sccm. Further, the flow rate of the $H_2$ gas in the first gas is set to a predetermined value within the range of, for example, 20 to 1,000 sccm, specifically 20 to 500 sccm. The content ratio of the $H_2$ gas and the $O_2$ gas contained in the first gas is set to a predetermined value in the range of 0:100 to 95:5. That is, the ratio of the $H_2$ gas (the content or content rate of hydrogen contained in the first gas) is set to a predetermined value within the range of 0 to 95%. More specifically, for example, the total flow rate of the first gas is set to 1,000 sccm, and the content ratio of the $H_2$ gas and the $O_2$ gas is set to 10:90 (hydrogen content or content rate of 10%).

It is preferable to directly supply the first gas to the outer peripheral region of the process chamber 201, which is a region where the ring-shaped plasma formed in a plasma-processing step S140 to be described later is generated.

At the same time, the supply of a mixture of $O_2$ gas and $H_2$ gas as the second gas, which is a hydrogen-concentration-adjusting gas, from the second gas supply part to the central region of the process chamber 201 is started. Specifically, the valve 253d and the valve 253e are opened, and the supply of the second gas into the process chamber 201 via the gas ejection holes 303 installed in the gas supply ring 300 is started while its flow rate is controlled by the MFC 252d and the MFC 252e.

By controlling the flow rate with the MFC 252d and the MFC 252e, at least one selected from the group of the total flow rate of the second gas and the composition of the second gas (particularly, the hydrogen content or content rate) is adjusted. Similar to the first gas, it is possible to easily adjust the composition of the second gas by changing the mixture ratio of the $H_2$ gas and the $O_2$ gas.

At this time, the total flow rate of the second gas is set to be equal to or less than the total flow rate of the first gas, for example, 100 to 5,000 sccm, and the flow rate of the $O_2$ gas in the second gas is set to a predetermined value within the range of, for example, 0 to 5,000 sccm, specifically 0 to 500 sccm. Further, the flow rate of the $H_2$ gas in the second gas is set to a predetermined value in the range of, for example, 0 to 5,000 sccm, specifically 0 to 500 sccm. In the present embodiments, the ratio of the $H_2$ gas contained in the second gas (that is, the hydrogen content or content rate of the first gas) is set to a predetermined value within the range of 0 to 100%. The total flow rate of the second gas is preferably equal to or less than that of the first gas. When the flow rate of the second gas is larger than the flow rate of the first gas, the concentrations and content ratio of the $H_2$ gas and the $O_2$ gas in a plasma generation region (to be described later) in the process chamber 201 are greatly affected by the second gas. This makes it difficult to control plasma excitation in the plasma generation region and control the generation of oxidizing species generated by plasma. Therefore, as a particularly suitable example, for example, the total flow rate of the second gas is set to 100 sccm, and the content ratio of the $H_2$ gas and the $O_2$ gas is set to 20:80 (hydrogen content or content rate of 20%).

(Hydrogen Concentration Distribution Control)

In this step, it is possible to control the hydrogen concentration distribution in the process chamber 201 by controlling at least one selected from the group of the flow rate and the hydrogen content (or content rate) of each of the first gas and the second gas. The hydrogen concentration distribution is controlled so that the oxidizing species in the plasma-processing step to be described later has a desired density distribution. It is preferable that the hydrogen content or content rate of the second gas is adjusted so as to be different from the hydrogen content or content rate of the first gas. By using the second gas having the hydrogen content or content rate different from that of the first gas, it becomes easy to control the flow rates of the first gas and the second gas, respectively, and thus adjust the hydrogen concentration distribution in the process chamber 201. The hydrogen content or content rate of the second gas can be adjusted to be higher than the hydrogen content or content rate of the first gas, or can be adjusted to be lower than the hydrogen content or content rate of the first gas.

The exhaust of the interior of the process chamber 201 is controlled by adjusting the opening degree of the APC valve 242 so that the internal pressure of the process chamber 201 becomes a predetermined pressure in the range of, for example, 5 to 260 Pa. In this way, while appropriately exhausting the interior of the process chamber 201, the supply of the first gas and the second gas is continued until the end of the plasma-processing step S140 to be described later.

(Plasma-Processing Step S140)

When the internal pressure of the process chamber 201 is stabilized, the application of high frequency power to the resonance coil 212 from the high frequency power supply 273 is started. As a result, a high frequency electric field is formed in the plasma-generating space 201a to which the $O_2$ gas and the $H_2$ gas are supplied, and a ring-shaped induced plasma with the highest plasma density is excited at the position at a height corresponding to the electrical midpoint of the resonance coil 212 in the plasma-generating space by this electric field. The $O_2$ gas and the $H_2$ gas in the plasma state are dissociated to generate oxidizing species such as oxygen radicals such as hydroxyl radicals (OH radicals) and O radicals containing O, atomic oxygen (O), ozone ($O_3$), and oxygen ions.

In this step, the first gas is supplied to the plasma generation region, which is a region where plasma is generated at the first plasma density. In the present embodiments, the first gas is supplied to the plasma generation region, which is a region in which the ring-shaped plasma is excited, in the outer peripheral region in the process chamber 201 close to the resonance coil 212, and the above-mentioned oxidizing species are generated as the first gas is mainly plasma-excited.

On the other hand, in this step, the second gas is supplied to a region where plasma is generated at a second plasma density lower than the first plasma density, or a plasma non-generation region which is a region where plasma is not generated (a region where the second plasma density is substantially 0). That is, the second gas is supplied to a region where the plasma density is different from that of the first gas. In the present embodiments, in particular, the second gas is supplied to the plasma non-generation region formed inside the ring-shaped plasma.

That is, in the present embodiments, at least a portion of the outer peripheral region of the process chamber 201 is the plasma generation region where the ring-shaped plasma is generated along the inner wall of the process chamber 201, and the central region of the process chamber 201 is the plasma non-generation region.

(Density Distribution Control of Oxidizing Species)

Here, the oxidizing species generated by the plasma loses or deteriorates (that is, deactivates) its capability as oxidizing species (oxidizing capability) when it reacts with hydrogen in the atmosphere. Therefore, the decay rate (decay amount) of the density (concentration) of the oxidizing species in the atmosphere changes according to the hydrogen concentration in the atmosphere in which the oxidizing species is present. The higher the hydrogen concentration, the higher the decay amount of the oxidizing species, and the lower the hydrogen concentration, the lower the decay amount of the oxidizing species.

In the present embodiments, when the oxidizing species generated in the plasma generation region diffuses in the plasma non-generation region, it reacts with hydrogen in the plasma non-generation region and is gradually deactivated. Therefore, the decay amount of the density of oxidizing species diffused in the plasma non-generation region can be adjusted according to the hydrogen concentration in the plasma non-generation region. That is, the density distribution of oxidizing species in the plasma non-generation region can be arbitrarily adjusted by controlling the hydrogen concentration distribution in the plasma non-generation region.

Specifically, in the above-described reaction gas supply step, by adjusting at least one selected from the group of the flow rate of the second gas or the content or content rate of hydrogen mainly supplied to the plasma non-generation region, the hydrogen concentration distribution in the in-plane direction of the wafer 200 in the plasma non-generation region is controlled. Then, by controlling this hydrogen concentration distribution, the density distribution of the oxidizing species diffused in the space above the wafer 200 is adjusted. In this way, the oxidizing species whose density distribution in the in-plane direction of the wafer 200 is adjusted is supplied to the surface of the wafer 200. The method of controlling the hydrogen concentration distribution in the plasma non-generation region in the present embodiments will be described in detail in the description of Examples to be described later according to the present embodiments.

Further, the hydrogen concentration distribution in the plasma non-generation region is controlled according to a distance from the plasma generation region, more specifically a distance from a region where the ring-shaped plasma is formed in the direction from the outer periphery of the process chamber 201 to the center thereof.

The oxidizing species generated by the ring-shaped plasma formed in the outer peripheral region is supplied to the wafer 200 while being diffused in a region (space) above the processing surface of the wafer 200 from the outer periphery of the wafer 200 toward the center thereof. In the present embodiments, it may be regarded that the ring-shaped plasma is formed with substantially a uniform density (intensity) in the inner peripheral direction of the process chamber 201, and the density of the oxidizing species generated by the plasma is also substantially uniform in the inner peripheral direction of the process chamber 201. Therefore, by grading the hydrogen concentration distribution according to the distance from the plasma generation region in the radial direction of the process chamber 201 (that is, the radial direction of the wafer 200), it is possible to control the density distribution of oxidizing species in the in-plane direction of the wafer 200 to be an arbitrary distribution while uniformalizing the density distribution of oxidizing species in the inner peripheral direction of the process chamber 201.

Further, in the present embodiments, the type of oxidizing species whose density distribution is controlled is not particularly limited, but the present embodiments can be suitably used for controlling the density distribution of oxygen radicals and atomic oxygen (O) diffused in the process chamber 201 without being accelerated by an electromagnetic field.

After that, when a predetermined processing time (for example, 10 to 900 seconds) elapses, the output of the electric power from the high frequency power supply 273 is stopped to stop plasma discharge in the process chamber 201. Further, the valves 253a, 253b, 253d, and 253e are closed to stop the supply of the first gas and the second gas into the process chamber 201. From the above, the plasma-processing step S140 is completed.

(Vacuum-Exhaust Step S150)

When the supply of the first gas and the second gas is stopped, the interior of the process chamber 201 is vacuum-exhausted through the gas exhaust pipe 231. As a result, the $O_2$ gas and the $H_2$ gas in the process chamber 201, an exhaust gas generated by the reaction of these gases, and the like are exhausted to the outside of the process chamber 201. After that, the opening degree of the APC valve 242 is adjusted to adjust the internal pressure of the process chamber 201 to the same pressure as the vacuum transfer chamber adjacent to the process chamber 201.

(Substrate-Unloading Step S160)

After that, the susceptor 217 is lowered to the transfer position of the wafer 200, and the wafer 200 is supported on the wafer push-up pins 266. Then, the gate valve 244 is opened, and the wafer 200 is loaded out of the process chamber 201 by using the wafer transfer mechanism. From the above, the substrate-processing process according to the present embodiments is completed.

(3) Relationship among Hydrogen Concentration in Atmosphere, Distance from Plasma, and Oxidizing Species Density (Oxidizing Species Concentration)

Figure 5:
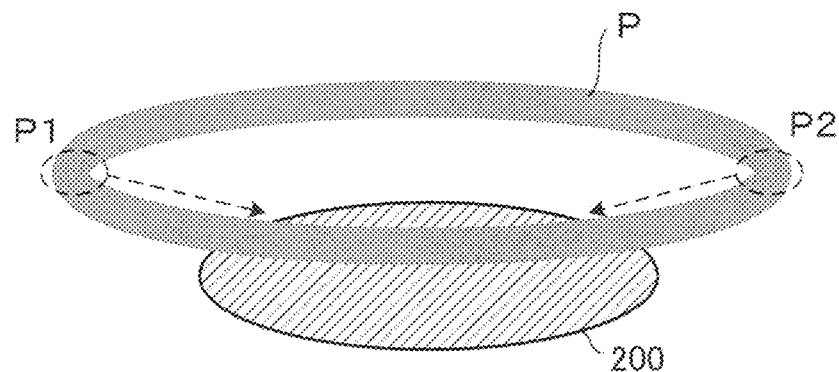
FIG. 5 is a schematic view for explaining plasma formed on a substrate.

FIG. 5 is a view for explaining plasma generated on the wafer 200. As described above, the plasma generated by the plasma generator according to the present embodiments is formed in the ring shape on the outer edge of the wafer 200 or above the outside thereof in the outer peripheral region in the process chamber 201 near the resonance coil 212. In this case, the plasma density (intensity) becomes high in the outer peripheral region of the wafer 200, and the plasma density becomes low or substantially zero in the central region where the wafer 200 is placed. That is, the plasma density distribution becomes non-uniform in the plane direction of the wafer 200 in the plasma-generating space 201a. Specifically, the plasma is formed so that the plasma density in the outer peripheral region is higher than the plasma density in the central region.

Then, oxidizing species is generated in the outer peripheral region of the wafer 200 on which the plasma is formed. This oxidizing species is diffused in the central region, reaches the wafer 200, and contributes to film formation.

Ring-shaped plasma P, which is the source of the oxidizing species, is biased to the outer peripheral region of the wafer 200. Therefore, the ring-shaped plasma P reacts with hydrogen (112 gas in the present embodiments) in the atmosphere and is gradually deactivated in the process of diffusion of the oxidizing species. Therefore, the density of oxidizing species tends to decrease according to a distance from the plasma P.

COMPARATIVE EXAMPLE

Figure 6A:
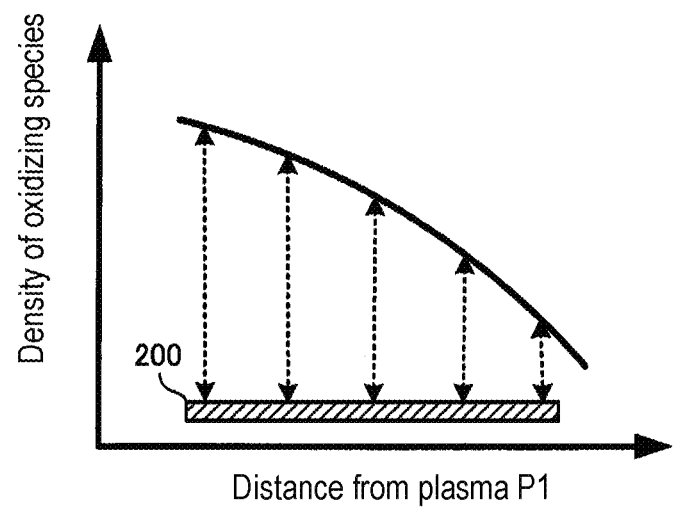
FIG. 6A is a diagram showing the relationship between a distance from plasma P1 when a hydrogen concentration distribution is constant and the density of oxidizing species generated by the plasma P1.
Figure 6B:
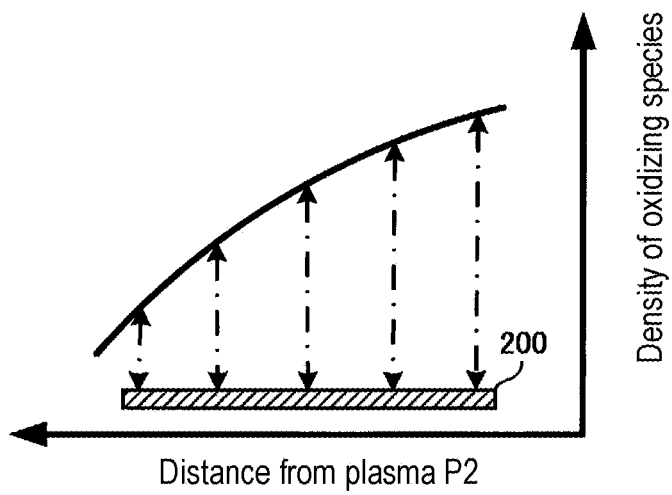
FIG. 6B is a diagram showing the relationship between a distance from plasma P2 when the hydrogen concentration distribution is constant and the density of oxidizing species generated by the plasma P2.
Figure 6C:
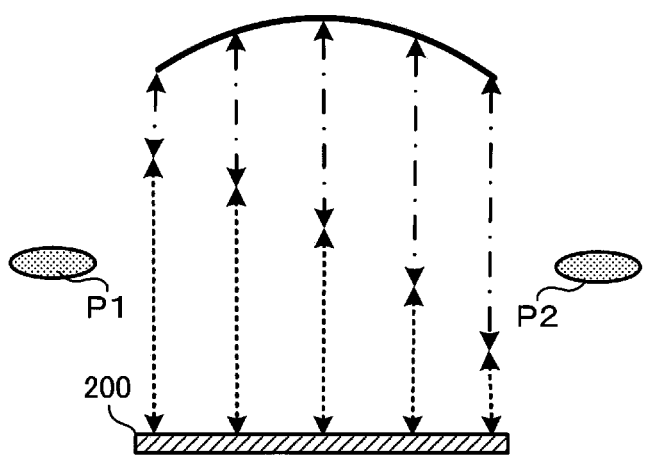
FIG. 6C is a diagram showing the distribution of oxidizing species generated on a substrate by the plasmas P1 and P2 when the hydrogen concentration distribution is constant.

FIGS. 6A to 6C are diagrams showing the relationship between a distance from plasma and the density of oxidizing species when the hydrogen concentration distribution in a space (for example, in the central region) above the wafer 200 where the oxidizing species diffuses is made uniform (Comparative Example). Plasma P1 and plasma P2 in FIGS. 6A to 6C are portions of plasma P generated at positions facing each other with the center of the wafer 200 interposed therebetween, as shown in FIG. 5, respectively.

In the Comparative Example, as shown in FIG. 6A, the density of oxidizing species generated by the plasma P1 decreases (decays) in a convex curved shape above the wafer 200 with a distance from the plasma P1. Further, as shown in FIG. 6B, the density of oxidizing species generated by the plasma P2 on the side facing the plasma P1 also decreases in a convex curved shape above the wafer 200 with a distance from the plasma P2. As shown in FIG. 6C, the distribution of the density of oxidizing species above the wafer 200, which is generated and diffused by the ring-shaped plasma P formed above the outer edge of the wafer 200 or the outside thereof, is a result of addition of the density distributions of oxidizing species shown in FIGS. 6A and 6B. That is, since the density of oxidizing species increases above the center of the wafer 200, more oxidizing species are supplied relative to the in-plane center of the wafer 200, and as a result, an oxide film is formed in a convex shape on the wafer 200. That is, when the hydrogen concentration in the atmosphere in the space above the wafer 200 in which the oxidizing species is diffused is made uniform, the density distribution of oxidizing species may become non-uniform in the in-plane direction of the wafer.

Example According to the Present Embodiments

On the other hand, according to the substrate processing apparatus 100 in the present embodiments, by controlling the hydrogen concentration distribution in the process chamber 201 as follows, the density distribution of oxidizing species generated by the plasma which is non-uniform in the plane direction of the wafer 200 can be made uniform in the in-plane direction of the wafer.

Figure 7:
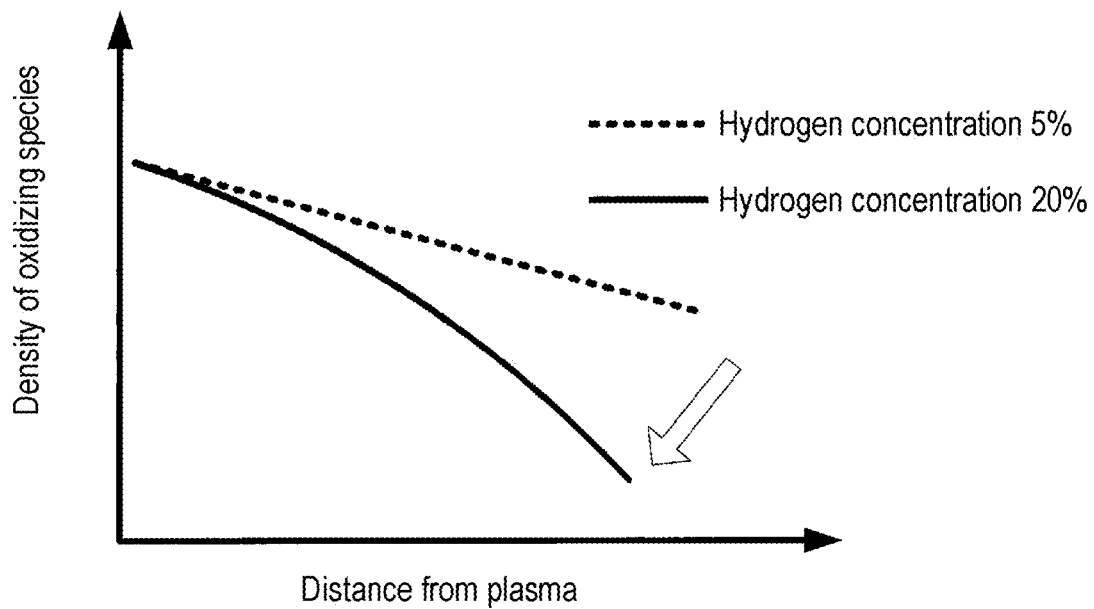
FIG. 7 is a diagram showing the relationship between the hydrogen concentration, a distance from plasma P, and the density of oxidizing species generated by the plasma P.

Here, FIG. 7 is a diagram showing the relationship between a distance from plasma and the density of oxidizing species generated by this plasma in a case where the hydrogen concentration distribution in the atmosphere in the space where the oxidizing species is diffused is uniformly set to 5% and in a case where the hydrogen concentration distribution is uniformly set to 20%.

As shown in FIG. 7, when the hydrogen concentration distribution in the atmosphere is uniformly set to 5%, the degree of decrease in the density of oxidizing species with respect to the distance from the plasma is relatively small, and the density distribution of oxidizing species tends to be a gentle curve with a small slope. On the other hand, when the hydrogen concentration in the atmosphere is further increased and the distribution thereof is uniformly set to 20%, the degree of decrease in the density of oxidizing species increases as the distance from the plasma increases, and the density distribution of oxidizing species tends to have an upwardly convex curved shape with a large slope.

Figure 8:
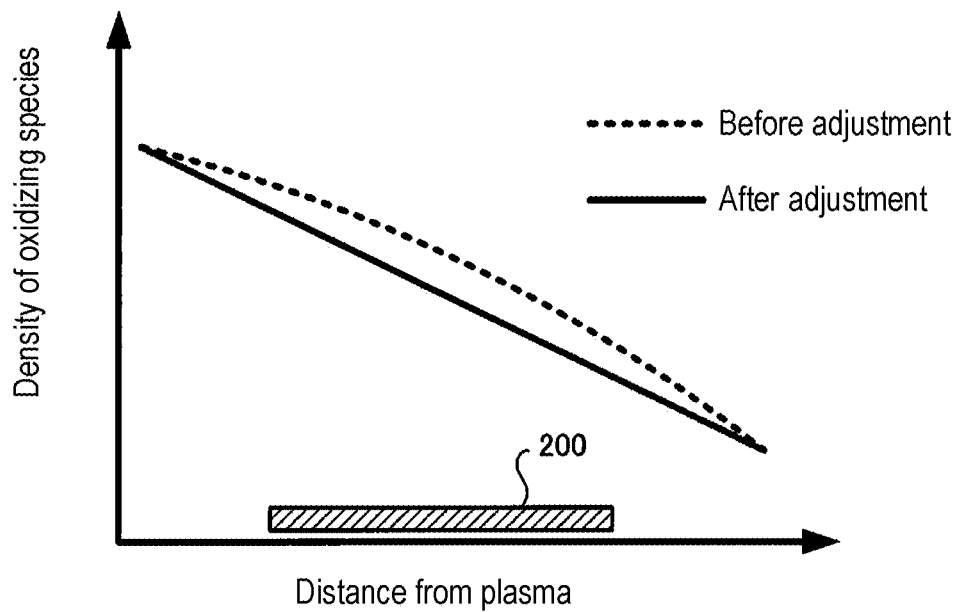
FIG. 8 is a diagram for explaining the relationship between a distance from the plasma P before and after adjusting the hydrogen concentration distribution in a process chamber 201 and the density of oxidizing species generated by the plasma P.

Further, FIG. 8 is a diagram showing an example in which the density distribution of oxidizing species is controlled by adjusting the hydrogen concentration distribution in a space where the oxidizing species is diffused according to a distance from plasma. A broken line in FIG. 8 indicates the relationship between the density of oxidizing species and a distance from plasma when the hydrogen concentration in a space where the oxidizing species is diffused is uniformly set to 10% (before adjustment). A solid line indicates the relationship between the density of oxidizing species and the distance from the plasma when the hydrogen concentration distribution in the space where the oxidizing species is diffused is adjusted (after adjustment) from the case of the broken line (before adjustment). In the example before adjustment shown by the broken line, the density distribution of oxidizing species with respect to the distance from the plasma becomes an upwardly convex curve.

Here, as described above with reference to FIG. 7, the degree of decrease in the density of oxidizing species with respect to the distance from the plasma is relatively larger in a space where the hydrogen concentration is high than in a space where the hydrogen concentration is low. Therefore, in the example after adjustment shown by the solid line, by supplying another gas having a different hydrogen concentration, which is a hydrogen-concentration-adjusting gas, to a specific region in the space where the oxidizing species is diffused, the density distribution of oxidizing species is adjusted so that it becomes a straight line (linear) with respect to the distance from the plasma.

More specifically, in this example after adjustment, a gas having the hydrogen concentration of 20% is locally supplied as the hydrogen-concentration-adjusting gas into a space above the vicinity of the center of the wafer 200 (hereinafter referred to as an upper space of wafer center) disposed in the space where the oxidizing species is diffused. As a result, the hydrogen concentration distribution is graded so that the hydrogen concentration in the upper space of wafer center is locally increased and the hydrogen concentration is decreased as a distance from the upper space of wafer center increases. Then, the gradient of the hydrogen concentration in the upper space of wafer center or the hydrogen concentration that changes as the distance from the upper space of wafer center increases is adjusted so that the density distribution of oxidizing species with respect to the distance from the plasma becomes a straight line (linear). This adjustment can be performed, for example by controlling at least one selected from the group of the hydrogen concentration and the flow rate of the hydrogen-concentration-adjusting gas.

Hereinafter, the present Example will be described in more detail on the basis of the apparatus shape of the substrate processing apparatus 100 in the present embodiments.

Figure 9A:
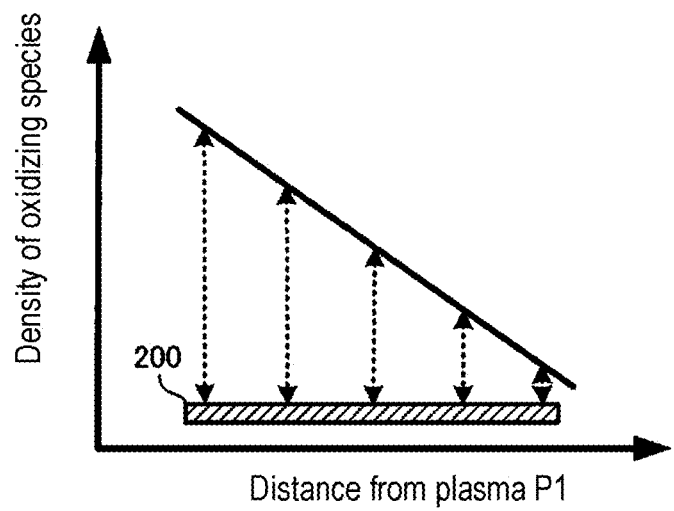
FIG. 9A is a diagram showing the relationship between a distance from plasma P1 after adjusting the hydrogen concentration distribution and the density of oxidizing species generated by the plasma P1
Figure 9B:
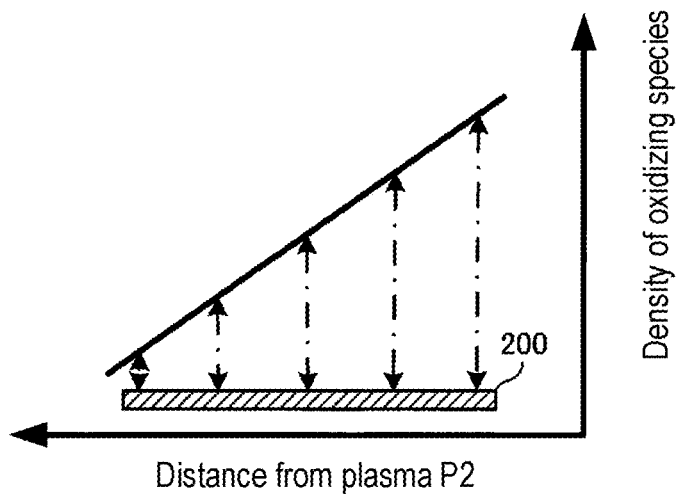
FIG. 9B is a diagram showing the relationship between a distance from plasma P2 after adjusting the hydrogen concentration distribution and the density of oxidizing species generated by the plasma P2.
Figure 9C:
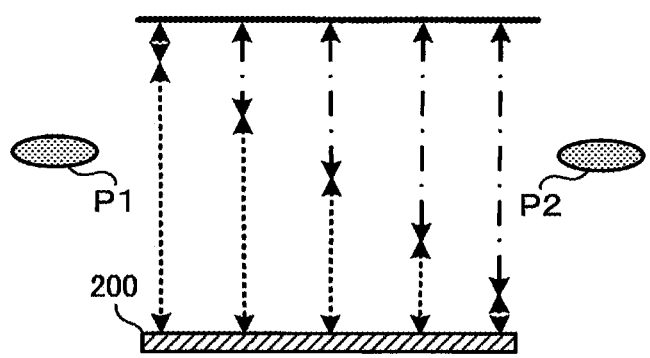
FIG. 9C is a diagram showing the distribution of oxidizing species generated on a substrate by the plasmas P1 and P2 after adjusting the hydrogen concentration distribution.

FIGS. 9A to 9C are diagrams showing the relationship between a distance from plasma and the density of oxidizing species when the hydrogen concentration distribution in the process chamber 201 is adjusted by using the substrate processing apparatus 100 in the present embodiments. In this Example, in the reaction gas supply step S130 in the above-described substrate-processing process, the hydrogen content ratio in the first gas as the oxidizing species source gas supplied to the outer peripheral region is set to 10%, and the hydrogen content ratio in the second gas as the hydrogen-concentration-adjusting gas supplied to the central region is set to 20%.

Here, the second gas is supplied into a space directly below the gas ejection holes 303 formed in the gas supply ring 300. The space directly below the gas ejection holes 303 can be considered to correspond to the above-mentioned wafer center upper space. That is, in this Example, the hydrogen concentration in the space directly below the gas ejection holes 303 is locally increased by locally supplying the second gas having the higher hydrogen content ratio than that of the first gas. In addition, the hydrogen concentration distribution is graded so that the hydrogen concentration of the second gas decreases (that is, approaches 10% which is the hydrogen concentration of the first gas) as the distance from the space directly below the gas ejection holes 303 increases.

This adjustment of the hydrogen concentration distribution can be performed mainly by controlling at least one selected from the group of the flow rate and the hydrogen content ratio of the second gas. Further, it is preferable to perform the adjustment by controlling at least one selected from the group of the flow rate and the hydrogen content ratio of the first gas in addition to the flow rate and the hydrogen content ratio of the second gas. Further, the adjustment can also be performed by adjusting the supply flow velocity and the supply direction of at least one selected from the group of the first gas and the second gas.

As shown in FIG. 9A, in this Example, the hydrogen concentration distribution is adjusted so that the density distribution of the oxidizing species generated by plasma P1 decays linearly above the wafer 200 as a distance from the plasma P1 increases. Further, as shown in FIG. 9B, in this Example, the hydrogen concentration distribution is adjusted so that the density distribution of the oxidizing species generated by plasma P2 on the side facing the plasma P1 decays linearly above the wafer 200 as a distance from the plasma P2 increases. As shown in FIG. 9C, the density distributions of the oxidizing species generated by the ring-shaped plasma P including the plasma P1 and the plasma P2 above the wafer 200 is a result of addition of the density distributions of the oxidizing species shown in FIGS. 9A and 9B. Therefore, the oxidizing species is supplied so that the density distribution of the oxidizing species generated by the ring-shaped plasma P above the wafer 200 is flat and uniform in the in-plane direction of the wafer 200 and accordingly is uniform in the in-plane direction with respect to the processing surface of the wafer 200. That is, an oxide film having good in-plane uniformity can be formed on the wafer 200.

In this way, by using the above-described substrate processing apparatus 100, the hydrogen concentration in the second gas in the vicinity of the center of the process chamber 201 (the center of the wafer 200) is increased so that the decay characteristic of the density of oxidizing species becomes linear. That is, by grading the hydrogen concentration distribution by adjusting the hydrogen concentration distribution in the process chamber 201 with the hydrogen concentration in the second gas supplied to the central region made higher than the hydrogen concentration in the first gas supplied to the outer peripheral region, it becomes possible to form a uniform film in the in-plane direction of the wafer.

That is, the hydrogen concentration distribution in the process chamber 201 can be adjusted by adjusting the supply flow rates, the mixture ratios, the hydrogen contents or content rates, etc. of the first gas and the second gas in the process chamber 201. That is, by adjusting the hydrogen concentration distribution in the process chamber 201, it is possible to control the density distribution (concentration distribution) of the oxidizing species supplied to the wafer 200 so as to be an arbitrary distribution.

Other Embodiments of the Present Disclosure

In the above-described embodiments, the example has been described in which the density distribution of oxidizing species above the wafer 200 is controlled to be uniform in the in-plane direction of the wafer 200 by adjusting the hydrogen concentration distribution in the process chamber 201. However, the present disclosure is not limited thereto, but the hydrogen concentration distribution in the process chamber 201 can be also controlled so that the density distribution of the oxidizing species above the wafer 200 has a central convex shape in the in-plane direction of the wafer 200 by the above-described substrate processing apparatus 100 and substrate-processing process. Further, the hydrogen concentration distribution in the process chamber 201 can be also controlled so that the density distribution of the oxidizing species above the wafer 200 has a central concave shape in the in-plane direction of the wafer 200. That is, according to the technique of the present disclosure, it is possible to control the in-plane distribution of the oxidizing species supplied to the processing surface of the wafer 200 to be an arbitrary distribution such as a uniform distribution, a central convex distribution, a central concave distribution, or the like.

Further, in the above-described embodiments, the example has been described in which the hydrogen content or content rate in the second gas is made higher than the hydrogen content or content rate in the first gas. However, the present disclosure is not limited thereto, but the hydrogen content or content rate in the second gas may be controlled to be lower than the hydrogen content or content rate in the first gas. This makes it possible to adjust the density distribution of the oxidizing species so as to suppress the decay of the oxidizing species in the central region by making the hydrogen concentration in the central region in the process chamber 201 lower than that in the outer peripheral region. That is, the hydrogen concentration distribution in the process chamber can be adjusted so that the density distribution of the oxidizing species in the in-plane direction of the wafer 200 has a uniform distribution as a central convex distribution or approaches a central concave distribution to a uniform distribution. By controlling the hydrogen contents or content rates of the first gas and the second gas to be different, it is possible to control the density distribution of the oxidizing species.

Further, in the above-described embodiments, the example has been described in which the first gas as the oxidizing species source gas and the second gas as the hydrogen-concentration-adjusting gas are supplied to the plasma generation region and the plasma non-generation region in the process chamber 201, respectively, to adjust the hydrogen concentration distribution in the process chamber 201. However, the technique of the present disclosure is not limited thereto, but can be suitably used in a case where the plasma density in the plasma-generating space is non-uniform (that is, biased). In such a case, the density distribution of the oxidizing species generated by the plasma is also biased due to the bias of the plasma density. Therefore, it is required to adjust the density distribution of the oxidizing species in the process chamber to a desired distribution (particularly a uniform distribution in the in-plane direction of the wafer). Therefore, according to the technique of the present disclosure, by individually supplying the hydrogen-concentration-adjusting gas into the process chamber separately from the oxidizing species source gas according to the plasma density distribution in the process chamber to adjust the hydrogen concentration distribution in the process chamber, it is possible to control the density distribution of the oxidizing species to be a desired distribution.

Further, in the above-described embodiments, the example has been described in which the surface of the substrate is oxidized by using the plasma. However, the present disclosure is not limited thereto, but can be applied to all techniques for performing a process to substrate by using plasma. For example, the present disclosure can be applied to a modifying process and a doping process to a film formed on a substrate surface by using plasma, a reduction process to an oxide film, an etching process to the oxide film, an ashing process for resist, and the like.

Further, in the above-described embodiments, the example has been described in which one gas supply part for supplying the hydrogen-concentration-adjusting gas is installed in the central region in addition to the outer peripheral region of the process chamber 201. However, the present disclosure is not limited thereto, but a plurality of gas supply parts for supplying the hydrogen-concentration-adjusting gas to the central region of the process chamber 201 may be installed and at least one selected from the group of the flow rate and the gas mixture ratio (hydrogen content ratio) of the supplied hydrogen-concentration-adjusting gas may be individually controlled. As a result, it is possible to adjust the hydrogen concentration distribution in the central region finely (with good controllability).

Further, if plasma is not uniformly formed in the circumferential direction, a gas supply part that supplies a hydrogen-concentration-adjusting gas to a specific position in the circumferential direction so as to correct the bias of oxidizing species density in the circumferential direction may be further installed.

Further, in the above-described embodiments, the example has been described in which one ring-shaped gas nozzle is installed in the central region in addition to the outer peripheral region of the process chamber 201 to adjust the hydrogen concentration distribution. However, but the present disclosure is not limited thereto, but one or more nozzles having various shapes may be installed.

Further, in the above-described embodiments, the example has been described in which the first gas and the second gas are simultaneously supplied. However, the present disclosure is not limited thereto, but the first gas and the second gas may be supplied at different timings.

Further, in the above-described embodiments, the example of using an ICP type substrate processing apparatus has been described. However, the present disclosure is not limited thereto, but can be applied to, for example, a MMT (Modified Magnetron Typed) type substrate processing apparatus or the like.

According to the present disclosure in some embodiments, it is possible to control the in-plane distribution of oxidizing species supplied on a substrate.

What is claimed is:

1. A method of manufacturing a semiconductor device, comprising:
   accommodating a substrate in a process chamber;
   supplying a first gas containing oxygen into the process chamber;
   generating plasma in the process chamber by exciting the first gas;
   supplying a second gas containing hydrogen into the process chamber and adjusting a hydrogen concentration distribution in the process chamber according to a density distribution of the plasma in the process chamber; and
   processing the substrate with oxidizing species generated by the plasma.

2. The method of claim 1, wherein in generating the plasma, the plasma is generated so that the density distribution of the plasma in the process chamber is non-uniform in a plane direction of the substrate.

3. The method of claim 1, wherein in supplying the first gas, the first gas is supplied to a first region in the process chamber, and
wherein in adjusting the hydrogen concentration distribution in the process chamber, the second gas is supplied to a second region which is a region above a processing surface of the substrate and is a region different from the first region in a plane direction of the substrate.

4. The method of claim 1, wherein in supplying the first gas, the first gas is supplied to a plasma generation region where the plasma is generated,
wherein in adjusting the hydrogen concentration distribution in the process chamber, the second gas is supplied to a plasma non-generation region where the plasma is not generated.

5. The method of claim 4, wherein a hydrogen concentration distribution in the plasma non-generation region is adjusted according to a distance from the plasma generation region.

6. The method of claim 1, wherein the hydrogen concentration distribution in the process chamber is controlled by adjusting a supply flow rate of the second gas.

7. The method of claim 1, wherein the hydrogen concentration distribution in the process chamber is controlled by adjusting a hydrogen content rate of the second gas.

8. The method of claim 1, wherein a space in the process chamber includes an outer peripheral region along an inner wall of the process chamber and a central region surrounded by the outer peripheral region, and the plasma is generated so that a density of the plasma in the outer peripheral region is higher than a density of the plasma in the central region.

9. The method of claim 8, wherein ring-shaped plasma along the inner wall of the process chamber is generated in the outer peripheral region.

10. The method of claim 1, wherein in adjusting the hydrogen concentration distribution in the process chamber, the hydrogen concentration distribution in the process chamber is adjusted so that a density distribution of the oxidizing species supplied to the substrate is uniform in a plane direction on a surface of the substrate.

11. The method of claim 1, wherein the first gas is a mixture of oxygen gas and hydrogen gas.

12. The method of claim 1, wherein the second gas is a mixture of oxygen gas and hydrogen gas.

13. The method of claim 1, wherein a hydrogen content rate of the first gas is different from a hydrogen content rate of the second gas.

* * * * *